(12) United States Patent
Yaegashi

(10) Patent No.: US 7,160,737 B2
(45) Date of Patent: Jan. 9, 2007

(54) METHOD FOR FABRICATING SEMICONDUCTOR DEVICE

(75) Inventor: Tetsuo Yaegashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/131,210

(22) Filed: May 18, 2005

(65) Prior Publication Data

US 2006/0148107 A1    Jul. 6, 2006

(30) Foreign Application Priority Data

Jan. 6, 2005    (JP)    ............................... 2005-001309

(51) Int. Cl.
*H01L 21/00*    (2006.01)
(52) U.S. Cl. ..................... 438/3; 438/681; 257/E21.59; 257/E21.584
(58) Field of Classification Search ............... 438/3, 438/238, 381, 257, 680, 681, 393, 396, 439, 438/243, 250, 253, 609, 706, 712, 753
See application file for complete search history.

(56) References Cited

U.S. PATENT DOCUMENTS 6,521,927 B1 * 2/2003 Hidaka et al. .............. 257/295
6,699,726 B1 * 3/2004 Hidaka et al. ................. 438/3
6,815,223 B1 * 11/2004 Celinska et al. ............... 438/3
2005/0118795 A1 * 6/2005 Hidaka et al. .............. 438/593

FOREIGN PATENT DOCUMENTS

JP          6-32613        2/1994
JP          2002-170938    6/2002
JP          2003-282560    10/2003

* cited by examiner

*Primary Examiner*—David Nhu
(74) *Attorney, Agent, or Firm*—Westerman, Hattori, Daniels & Adrian, LLP.

(57) ABSTRACT

A material of low viscosity is applied to a ferroelectric film 32 formed by MOCVD to form a buried layer 34. Then, anisotropic etching is made on the entire surface to remove the tops of convexities on the surface of the ferroelectric film 32, and the buried layer 34 remaining on the surface of the ferroelectric film 32 is removed. Thus, the surface morphology of the ferroelectric film 32 is improved and planarized. When the conduction film 36 and the ferroelectric film 32 are patterned by photolithography, prescribed patterns as designed can be formed without reflecting the incident exposure light in various directions. The method for fabricating a semiconductor device improves the surface morphology of the ferroelectric film formed by metal organic chemical vapor deposition.

10 Claims, 9 Drawing Sheets

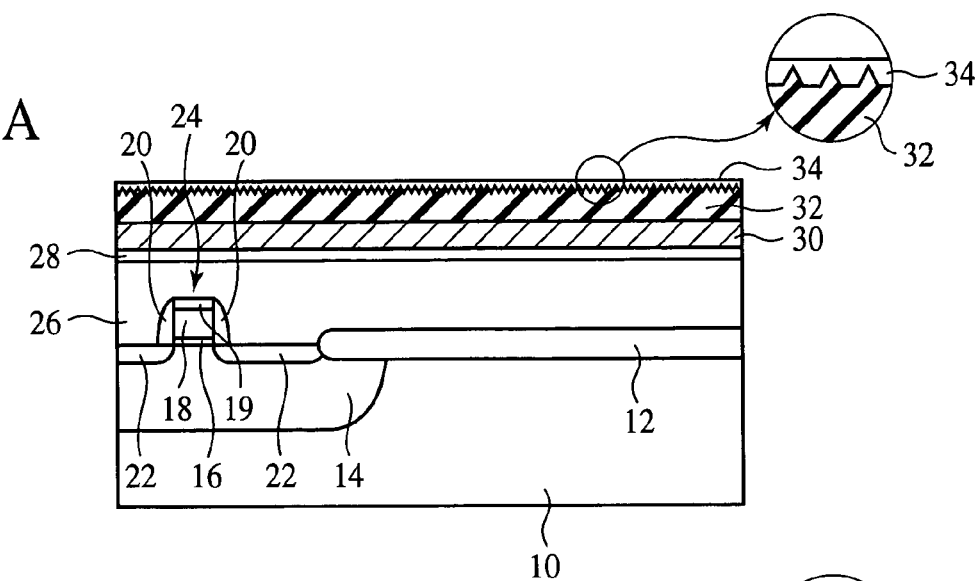
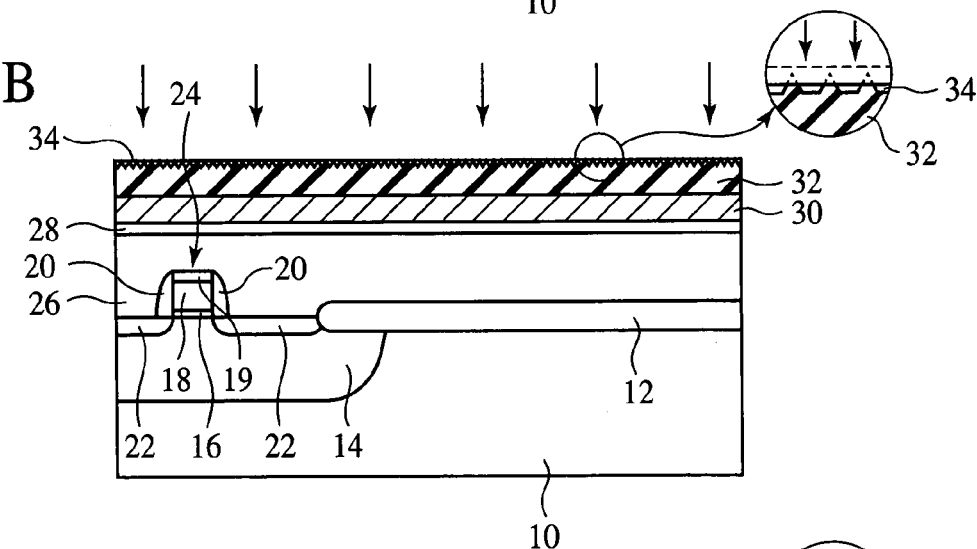
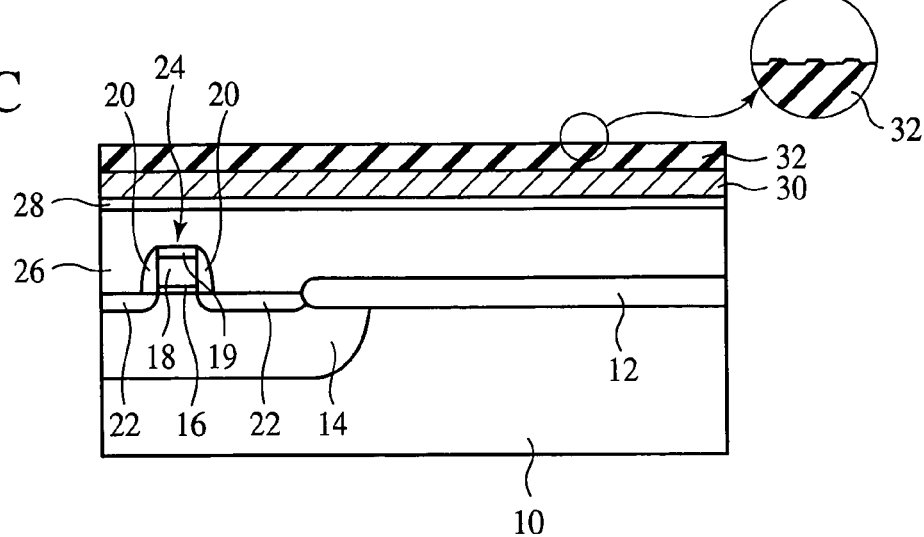

METHOD FOR FABRICATING SEMICONDUCTOR DEVICE

CROSS-REFERENCE TO RELATED APPLICATIONS

This application is based upon and claims priorities of Japanese Patent Application No. 2005-001309 filed on Jan. 6, 2005, the contents being incorporated herein by reference.

BACKGROUND OF THE INVENTION

The present invention relates to a method for fabricating a semiconductor device, more specifically a method for fabricating a semiconductor device in which ferroelectric film is formed by metal organic chemical vapor deposition.

Recently, it is noted to use ferroelectric materials as the dielectric film of capacitors. The FeRAM (Ferroelectric Random Access Memory) using such ferroelectric capacitors is a nonvolatile memory having characteristics of being operative at high speed, small electric power consumption, good write/read durability, etc. and is very prospective.

As materials of such ferroelectric film, ferroelectric materials having the layered perovskite structure, PZT (lead zirconate titanate), etc. are noted. To form such ferroelectric films, MOCVD (Metal Organic Chemical Vapor Deposition), which can deposit ferroelectric film on large-area substrates with good step coverage and at high rates, is noted.

When a ferroelectric film is formed by MOCVD, concavities and convexities are formed in the surface thereof due to its crystal structure, etc., which often causes the problem of rough surface morphology. When concavities and convexities are formed in the ferroelectric film surface, the concavities and convexities are formed also in the surface of a conducting film formed on the ferroelectric film. When a resist is applied to such conducting film, and light is applied to expose the resist, the incident light is diffused by the concavities and convexities in the conducting film surface, which makes it difficult to form patterns with good accuracy.

As countermeasures, the cavities in the ferroelectric film surface are filled with an insulation film to thereby improve the surface morphology (Patent Reference 1 and Patent Reference 2). The Patent Reference 1 is Specification of Japanese Patent Application Unexamined Publication No. 06-032613. The Patent Reference 2 is Specification of Japanese Patent Application Unexamined Publication No. 2003-282560. Patent Reference 3 is Specification of Japanese Patent Application Unexamined Publication No. 2002-170938.

However, filling the cavities in the ferroelectric film surface cannot sufficiently improve the surface morphology and furthermore, the insulation film buried in the ferroelectric film surface is left with a resultant problem that the characteristics of the ferroelectric capacitors are deteriorated.

SUMMARY OF THE INVENTION

An object of the present invention is to provide a method for fabricating a semiconductor device, which can improve the surface morphology of a ferroelectric film formed by metal organic chemical vapor deposition.

The method for fabricating a semiconductor device according to one aspect of the present invention comprises the steps of: forming a ferroelectric film by metal organic chemical vapor deposition; forming a buried layer filling cavities in the surface of the ferroelectric film; etching from above the buried layer to remove the tops of convexities of the surface of the ferroelectric film to thereby planarize the surface of the surface of the ferroelectric film; and removing the buried layer remaining on the surface of the ferroelectric film.

The method for fabricating a semiconductor device according to the present invention comprises the step of forming a ferroelectric film by metal organic chemical vapor deposition; the step of forming a buried layer filling cavities in the surface of the ferroelectric film; the step of etching from above the buried layer to remove the tops of convexities of the surface of the ferroelectric film to thereby planarize the surface of the surface of the ferroelectric film; and the step of removing the buried layer remaining on the surface of the ferroelectric film, whereby the surface morphology of the ferroelectric film formed by metal organic chemical vapor deposition can be improved.

BRIEF DESCRIPTION OF THE DRAWINGS

FIG. 9 is sectional views of a semiconductor device according to a second embodiment in the steps of the method for fabricating the semiconductor device, which illustrate the method.

DETAILED DESCRIPTION OF THE INVENTION

[A First Embodiment]

Figure 1:
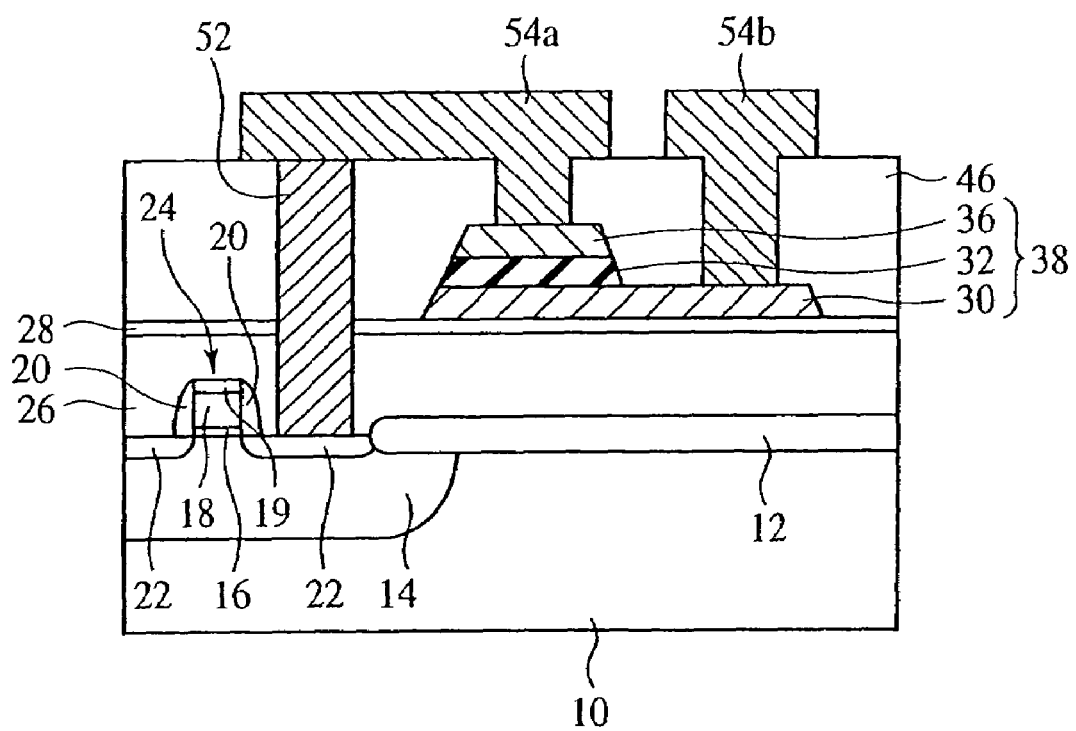
FIG. 1 is a sectional view of a semiconductor device according to a first embodiment of the present invention, which illustrates a structure thereof.

The method for fabricating a semiconductor device according to a first embodiment of the present invention will be explained with reference to FIGS. 1 to 8. FIG. 1 is a sectional view of the semiconductor device according to the present embodiment, which illustrates a structure thereof. FIGS. 2 to 7 are sectional views of the semiconductor device according to the present embodiment in the steps of the method for fabricating the semiconductor device, which illustrate the method. FIG. 8 is views illustrating problems of the conventional semiconductor device fabricating method.

(The Semiconductor Device)

The structure of the semiconductor device according to the present embodiment will be explained with reference to FIG. 1.

As illustrated in FIG. 1, device isolation regions 12 for a defining device region are formed on a semiconductor substrate 10, of, e.g., silicon. A well 14 is formed in the semiconductor substrate 10 with the device isolation regions 12 formed on.

A gate electrode (gate line) 18 is formed via a gate insulation film 16 on the semiconductor substrate 10 with the well 14 formed in. The gate electrode 18 has the polycide structure of, e.g., a metal silicide film, such as a tungsten silicide film or others, formed on a polysislicon film. An insulation film 19 of a silicon oxide film is formed on the gate electrode 18. A sidewall insulation film 20 is formed on the side walls of the gate electrode 18 and the insulation film 19.

A source/drain diffused layer 22 is formed on both sides of the gate electrode 18 with the sidewall insulation film 20 formed on. Thus, a transistor 24 including the gate electrode 18 and the source/drain diffused layer 22 is constituted.

An inter-layer insulation film 26 of, e.g., 700–800 nm-thickness silicon oxide film is formed on the semiconductor substrate 10 with the transistor 24 formed on. The surface of the inter-layer insulation film 26 is planarized.

A silicon oxide film 28 of, e.g., a 100 nm-thickness is formed on the inter-layer insulation film 26. A silicon oxide film 28 formed on the planarized inter-layer insulation film 26 is flat.

A lower electrode 30 of a ferroelectric capacitor 38 is formed on the silicon oxide fil 28. The lower electrode 30 is formed of, e.g., a 150–200 nm-thickness Pt film.

A ferroelectric film 32 of the ferroelectric capacitor 38 is formed on the lower electrode 28. The lower electrode 30 is formed of, e.g., a 100–150 nm-thickness $PbZr_{1-x}Ti_xO_3$ film (PZT) film.

An upper electrode 36 of the ferroelectric capacitor 38 is formed on the ferroelectric film 32. The upper electrode 36 is formed of, e.g., 150–250 nm-thickness $IrO_x$ film.

Thus, the ferroelectric capacitor including the lower electrode 30, the ferroelectric film 32 and the upper electrode 36 is constituted.

An inter-layer insulation film 46 of, e.g., a 1100 nm-thickness silicon oxide film is formed on the ferroelectric capacitor 38. The surface of the inter-layer insulation film 46 is planarized.

A contact hole is formed in the inter-layer insulation film 46, the silicon oxide film 28 and the inter-layer insulation film 26 down to the source/drain diffused layer 22. A conductor plug 52 of tungsten is buried in the contact hole.

In the inter-layer insulation film 46, contact holes are formed respectively down to the upper electrode 36 and down to the lower electrode 30. On the inter-layer insulation film 46, an interconnection 54a electrically connecting the conductor plug 52 and the upper electrode 36, and an interconnection 54b electrically connected to the lower electrode 30 are formed.

Thus, the source/drain diffused layer 22 of the transistor 24 and the upper electrode 36 of the ferroelectric capacitor 38 are electrically connected to each other via the conductor plug 52 and the interconnection 54a, and a memory cell of 1T (transistor) 1C (Cell)-type of an FeRAM, which includes 1 transistor 24 and 1 ferroelectric capacitor 38. Such memory cells are arranged in the memory cell region of the FeRAM chips.

(The Method for Fabricating the Semiconductor Device)

Next, the method for fabricating the semiconductor device according to the present embodiment will be explained with reference to FIGS. 2 to 7.

First, the device isolation regions 12 for defining the device region are formed on the silicon substrate 10 of, e.g., silicon by, e.g., LOCOS (LOCal Oxidation of Silicon).

Next, a dopant impurity is implanted by ion implantation to form the well 14.

Figure 2A:
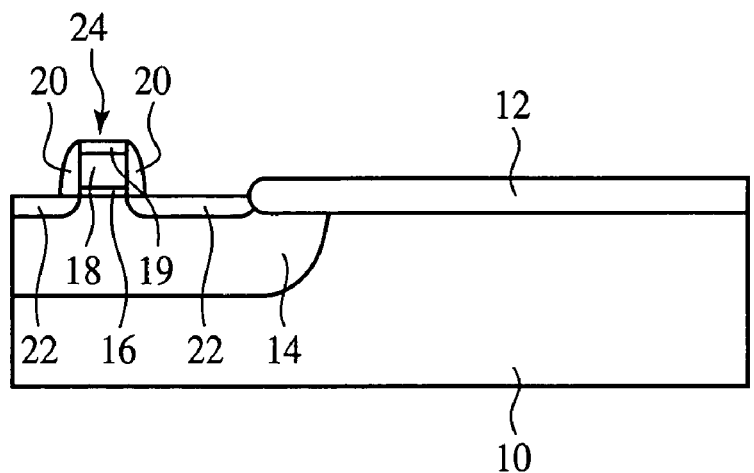
FIG. 2 is sectional views (Part 1) of the semiconductor device according to the first embodiment of the present invention in the steps of the method for fabricating the semiconductor device, which illustrate the method.

Next, the transistor 24 including the gate electrode (gate line) 18 and the source/drain diffused layer 22 is formed in the device region by the usual transistor forming method (FIG. 2A).

Figure 2B:
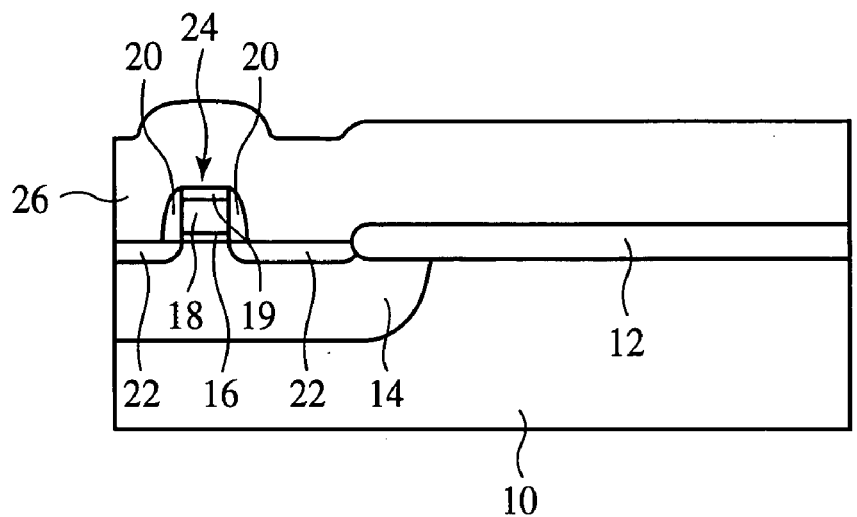

Then, a 600 nm-thickness silicon oxide film, for example, is deposited on the entire surface by, e.g., plasma TEOSCVD (Tetraethoxysilane Chemical Vapor Deposition) to form the inter-layer insulation film 26 (FIG. 2B).

Figure 2C:
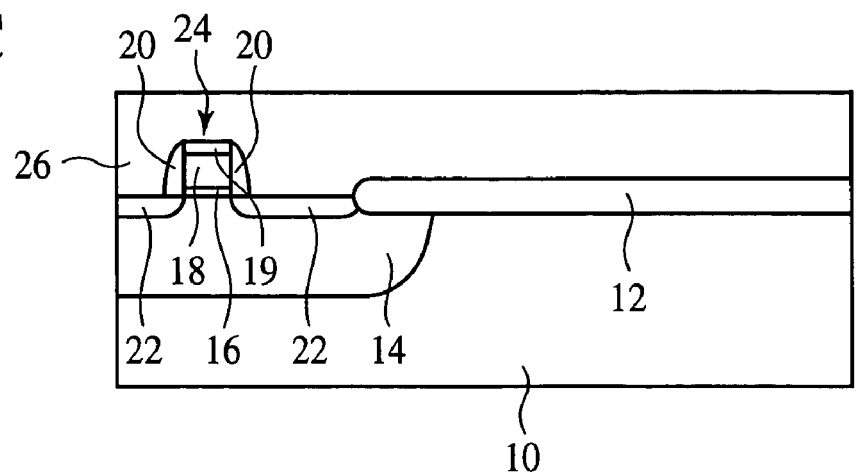

Next, the surface of the inter-layer insulation film 26 is planarized by, e.g., CMP (Chemical Mechanical Polishing) (FIG. 2C).

Figure 3A:
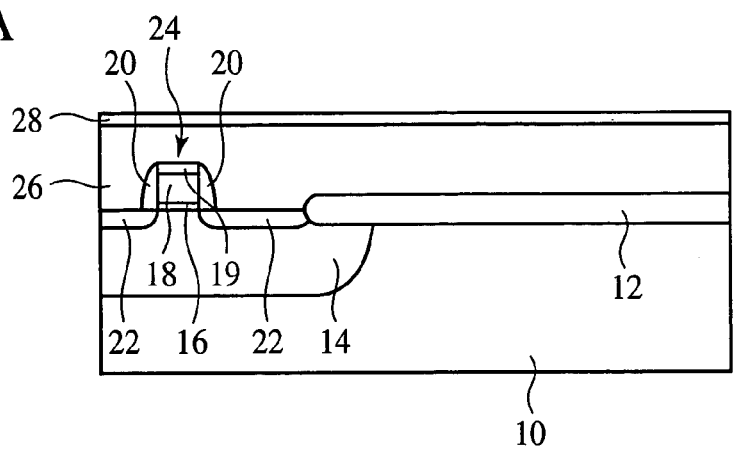
FIG. 3 is sectional views (Part 2) of the semiconductor device according to the first embodiment of the present invention in the steps of the method for fabricating the semiconductor device, which illustrate the method.

Next, the silicon oxide film 28 of, e.g., a 100 nm-thickness is formed on the entire surface by, e.g., plasma TEOSCVD (FIG. 3A).

Figure 3B:
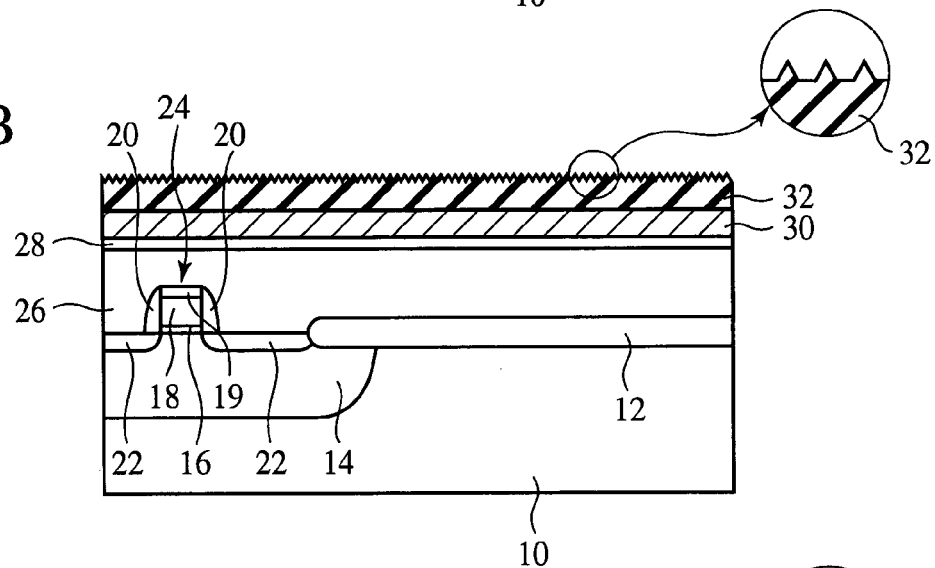

Next, a 100–200 nm-thickness Pt film 30, for example, is formed on the entire surface by, e.g., sputtering or MOCVD. The Pt film 30 is to be the lower electrode of the ferroelectric capacitor 38 (FIG. 3B).

Then, the ferroelectric film 32 is formed on the entire surface by MOCVD (Metal Organic Chemical Vapor Deposition). The ferromagnetic film 32 is a 100–150 nm-thickness PZT film, for example, is formed (FIG. 3B).

Conditions for the MOCVD (Metal Organic Chemical vapor Deposition) at this time are $Pb(Dtm)_2$, $Zr(Dmhd)_4$ and $Ti(O—Ipr)_2(Dtm)_2$, for example, and a reaction pressure of, e.g., 5 Torr.

When the PZT film of the ferroelectric film 32 is formed by MOCVD, large concavities and convexities are formed in the surface, and the PZT film has a rough surface morphology. In the surface of the PZT of, e.g., a 100–150 nm-thickness, convexities of a 10–20 nm-height are formed.

The method in which the fabrication of the semiconductor device is still advanced without making processing which is a countermeasure to the rough surface morphology will be explained with reference to FIG. 8.

Figure 8A:
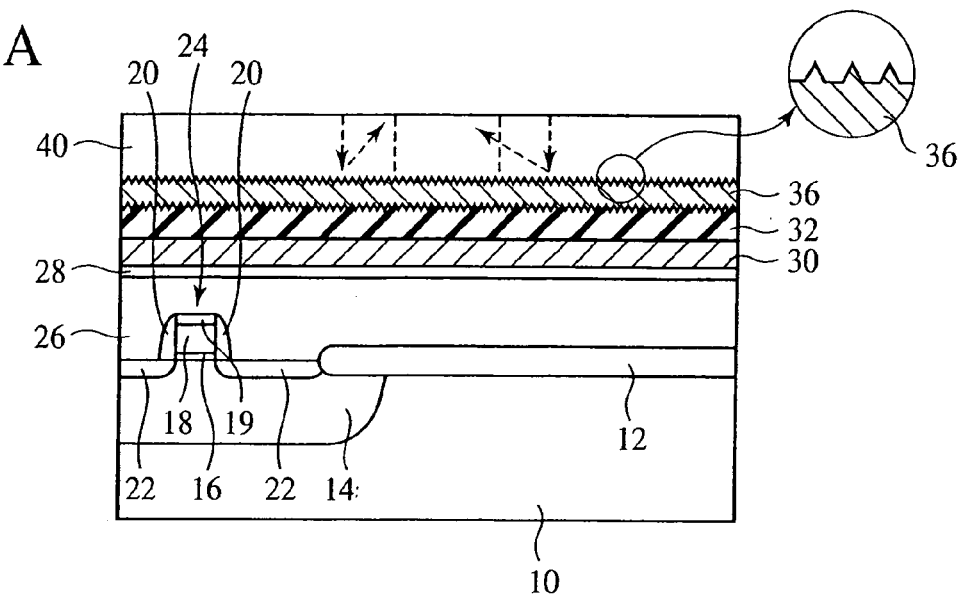
FIG. 8 is views explaining the problems of the conventional semiconductor device fabricating method.

When a conduction film 36 of, e.g., a 150–200 nm-thickness $IrO_x$ film is formed on the ferroelectric film 32 by, e.g., sputtering or MOCVD, the surface morphology is reflected as it is on the surface of the ferroelectric film 32, and the surface of the conductor film 36 also has a rough surface morphology (FIG. 8A).

Figure 8B:
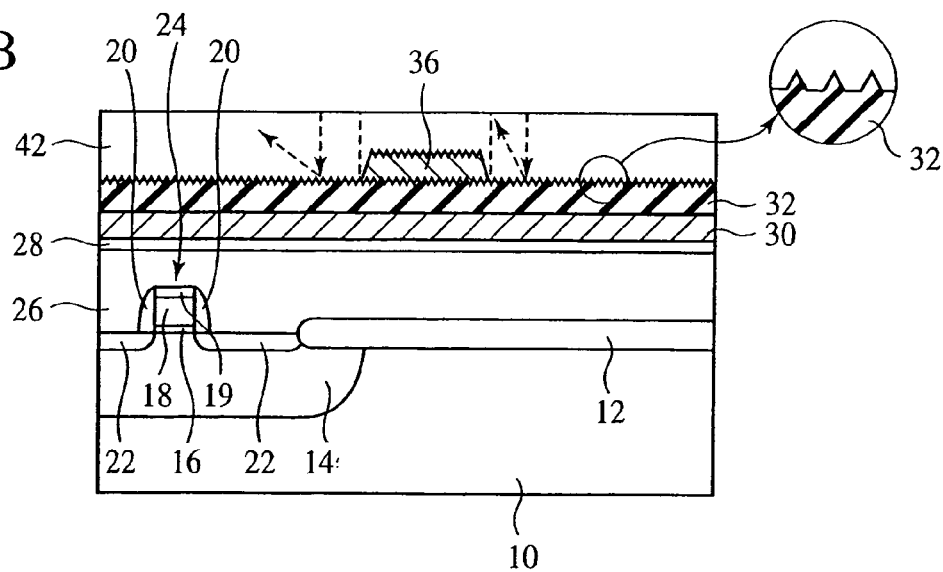

When a resist layer 40 is applied to the conduction film 36 and is exposed in prescribed patterns, incident exposure light is reflected in various directions on the concavities and convexities in the surface of the conduction film, and halation is caused (FIG. 8b). Resultantly, the resist layer 42 is not exposed in the prescribed patterns as designed, and the ferroelectric film 32 cannot be formed as designed.

Then, in the present embodiment, the surface morphology of the ferroelectric film 32 is improved by the method illustrated in FIGS. 3C to 4B.

Figure 3C:
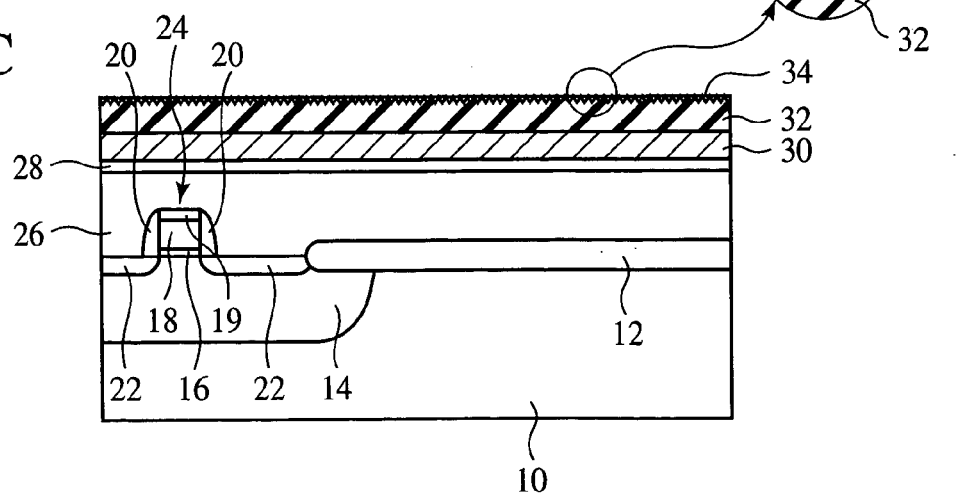

First, a material of a low viscosity of, e.g., 1–10 mPa·s (milli-Pascal second) is applied to the ferroelectric film 32 by sol-gel process, i.e., spin coating to form a buried layer 34 (FIG. 3C). The concavities in the ferroelectric film 32 are filled with the buried layer 34 with the convexities exposed out of the buried layer 34. The buried layer 34 is formed in a thickness so as to expose the tops of the convexities slightly exposed on the surface of the ferroelectric film 32, e.g., in an about 8–10 nm-thickness.

The buried layer 34 can be formed of a dielectric material, e.g., a resist material, a resist material excluding the photosensitizer, a silicon oxide-based material ($SiO_2$-based coating forming application liquid) or others.

Figure 4A:
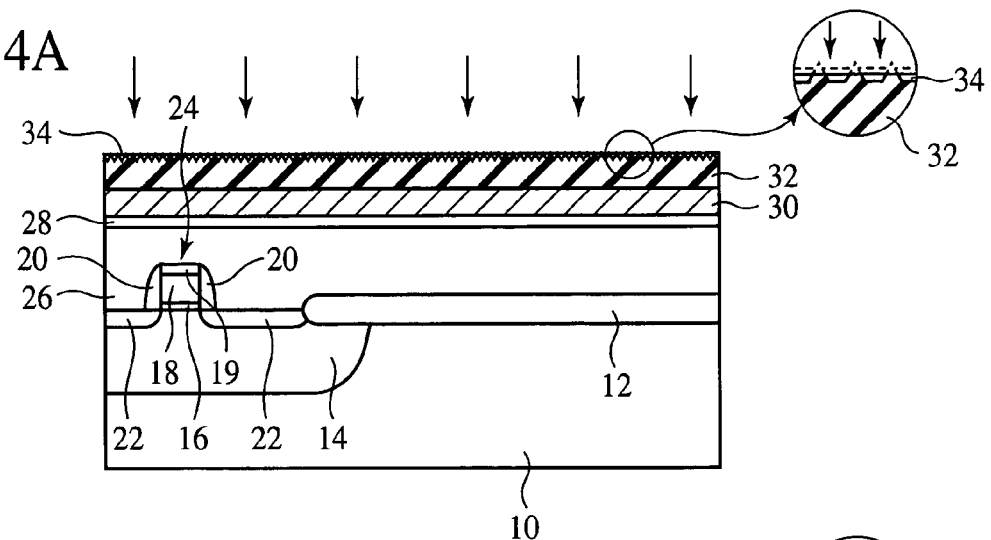
FIG. 4 is sectional views (Part 3) of the semiconductor device according to the first embodiment of the present invention in the steps of the method for fabricating the semiconductor device, which illustrate the method.

Then, the entire surface is anisotropically etched by, e.g., sputter etching to remove the tops of the convexities on the surface of the ferroelectric film 32, which are exposed out of the buried layer 34. At this time, the upper surface of the buried layer 34 is also etched off (FIG. 4A). The height of the convexities which has Been 10–20 nm is reduced to about 3–5 nm, and the entire surface is planarized.

Conditions for the sputter etching at this time are, e.g., chlorine gas ($Cl_2$) and argon gas (Ar) as the etching gas, e.g., 1400 W applied as the source power, and, e.g., 800 W applied as bias power.

Figure 4B:
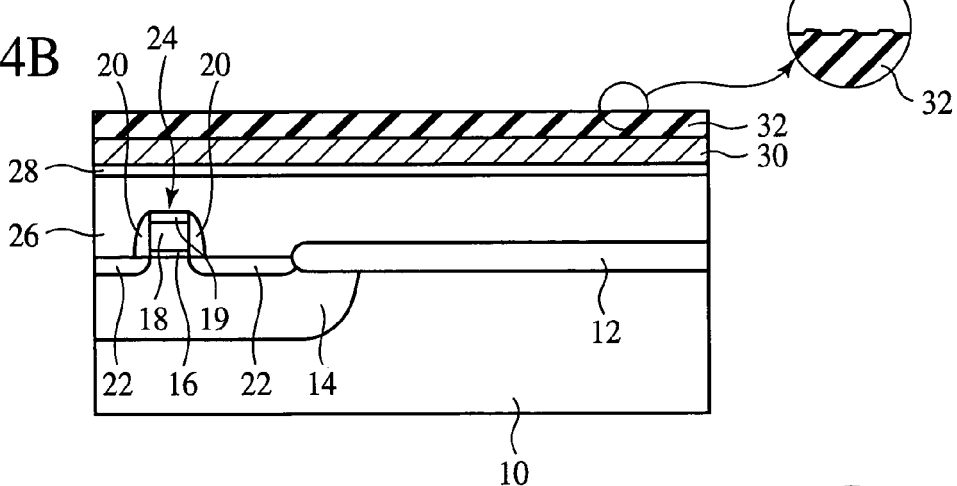
Figure 4C:
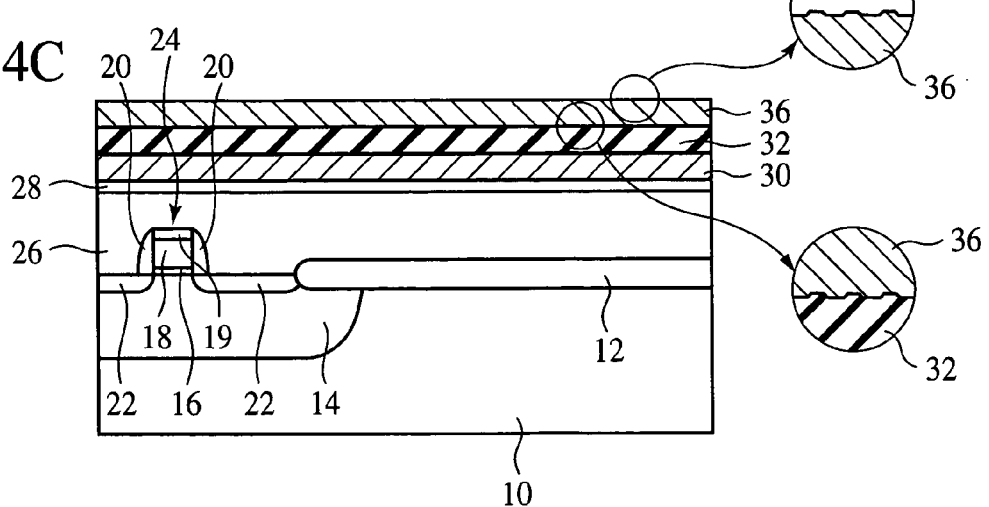

Then, the buried layer 34 remaining on the surface of the ferroelectric film 32 is removed, and the entire surface of the ferroelectric film 32 is exposed, planarized (FIG. 4b). The buried layer 34 formed of a resist material or a resist material excluding the photosensitizer is removed by ashing. The buried layer 34 of a silicon oxide-based material ($SiO_2$-based coating application solution) is removed by reactive ion etching (e.g., the etching gas: $CF_4+Ar+C_4F_8$; the power: 1000 W).

Thus, the surface morphology of the ferroelectric film 32 is improved.

Then, the conduction film 36 of, e.g., a 150–200 nm-thickness $IrO_x$ film is formed by, sputtering or MOCVD. The surface morphology of the ferroelectric film 32 is reflected as it is, and the surface of the conduction film 36 as well has good surface morphology.

Figure 5A:
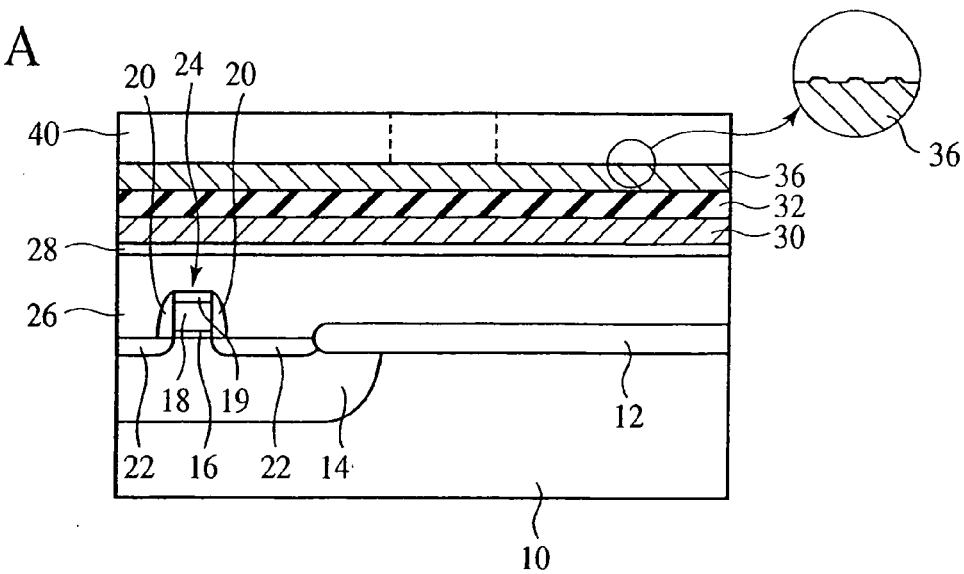
FIG. 5 is sectional views (Part 4) of the semiconductor device according to the first embodiment of the present invention in the steps of the method for fabricating the semiconductor device, which illustrate the method.

Then, a resist layer 40 is applied to the conduction film 36, and prescribed patterns are exposed on the resist layer 40. Because of the improved and planarized surface morphology of the conduction film 36, the incident exposure light is not reflected in various directions, and the prescribed patterns are exposed as designed (FIG. 5A).

Figure 5B:
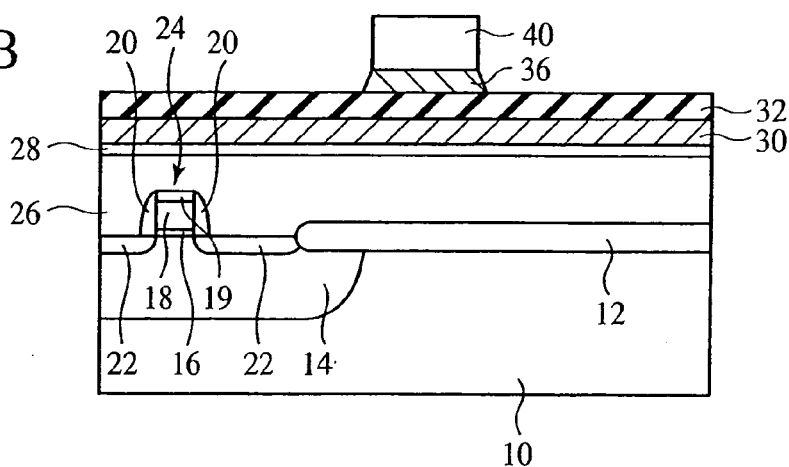

Then, the resist layer 40 is developed and patterned, and with the patterned resist layer 40 as the mask, the conduction film 36 is etched to form the upper electrode 36 (FIG. 5B).

Figure 5C:
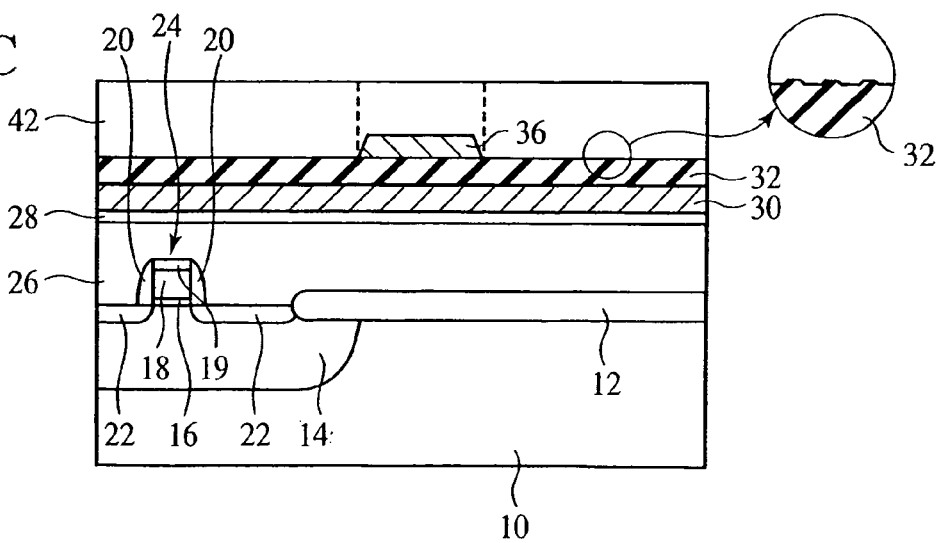

Next, a resist layer 42 is applied to the ferroelectric film 32. and prescribed patterns are exposed on the resist layer 42. Because of the improved and planarized surface morphology of the ferroelectric film 32, the incident exposure light is not reflected in various directions, and the prescribed patterns are exposed as designed (FIG. 5C).

Figure 6A:
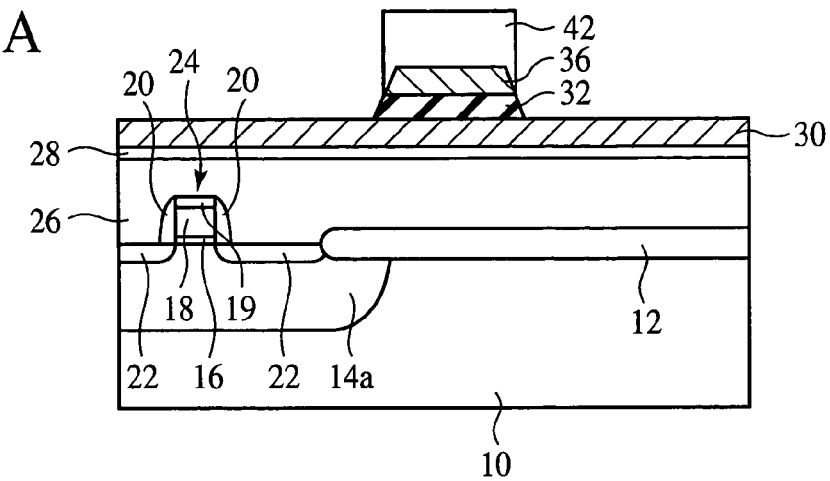
FIG. 6 is sectional views (Part 5) of the semiconductor device according to the first embodiment of the present invention in the steps of the method for fabricating the semiconductor device, which illustrate the method.

Then, the resist film 42 is developed and patterned, and with the patterned resist layer 42 as the mask, the ferroelectric film 32 is patterned (FIG. 6A).

Figure 6B:
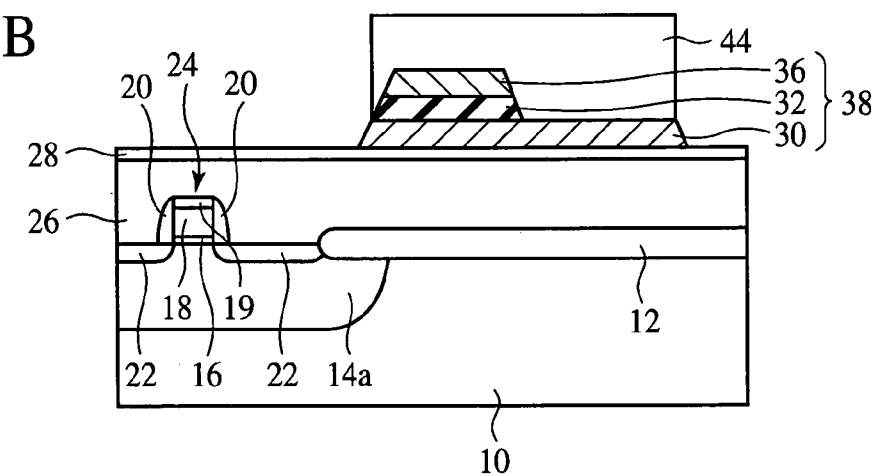

Then, the resist layer 44 is patterned in the same way, and with the patterned resist layer 44 as the mask, the conduction film 30 is etched to form the lower electrode (FIG. 6B).

Figure 6C:
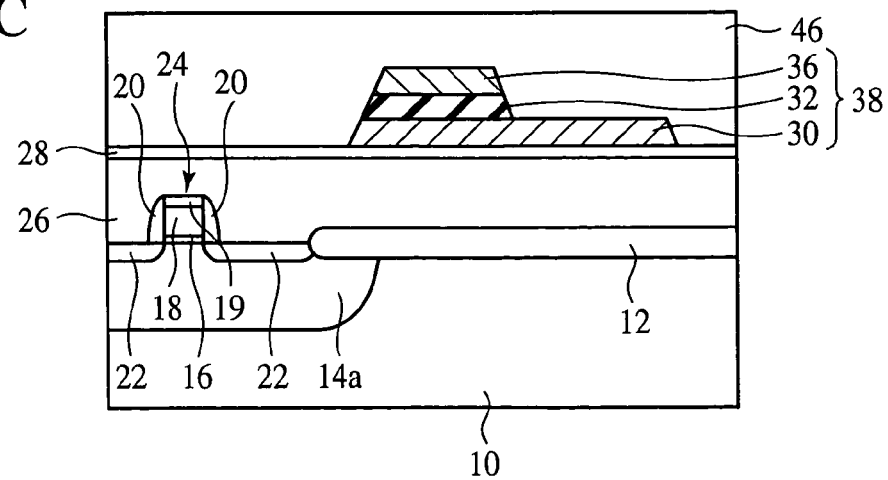

Next, the inter-layer insulation film 46 of, e.g., 1500 nm-thickness silicon oxide film is formed on the entire surface by, e.g., plasma TEOSCVD. Next, the surface of the inter-layer insulation film 46 is planarized by, e.g., CMP (FIG. 6C).

Figure 7A:
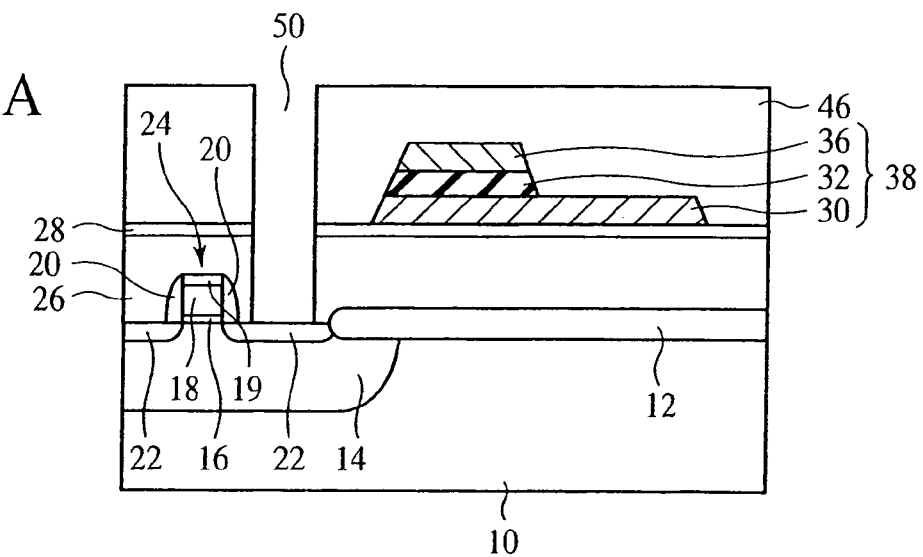
FIG. 7 is sectional views (Part 6) of the semiconductor device according to the first embodiment of the present invention in the steps of the method for fabricating the semiconductor device, which illustrate the method.

Then, the contact hole 50 is formed in the inter-layer insulation film 46, the silicon oxide film 28 and the inter-layer insulation film 26 down to the source/drain diffused layer 22 by photolithography and etching (FIG. 7A).

Next, a tungsten film of, e.g., a 500 nm-thickness is formed on the entire surface bv, e.g., CVD.

Figure 7B:
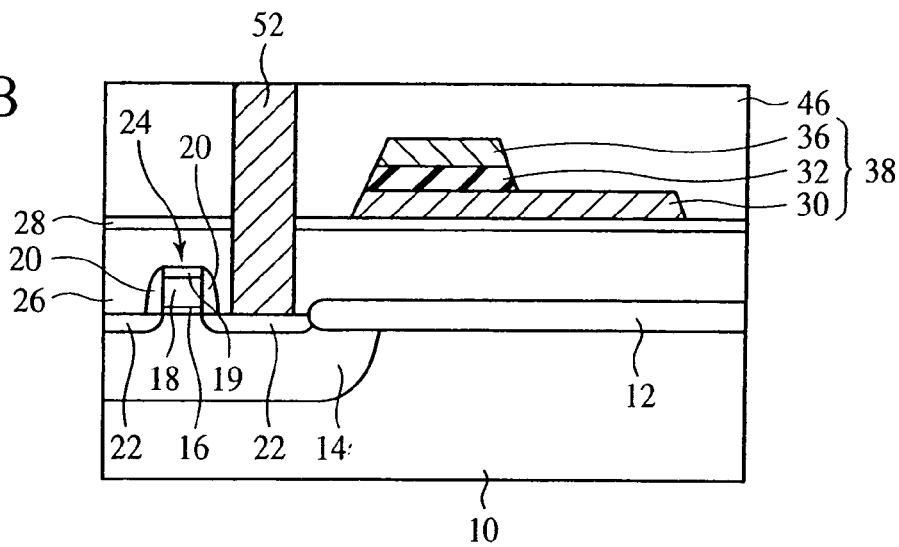

Next, the tungsten film and the barrier metal film are polished by. e.g., CMP until the surface of the inter-layer insulation film 36 is exposed. Thus, the conductor plug 52 of the tungsten is buried in the contact hole 50 (FIG. 7B).

The contact holes are formed in the inter-layer insulation film 46 respectively down to the upper electrode 36 of the ferroelectric capacitor 38 and on the lower electrode 30 of the ferroelectric capacitor 38 by photolithography and dry etching.

Figure 7C:
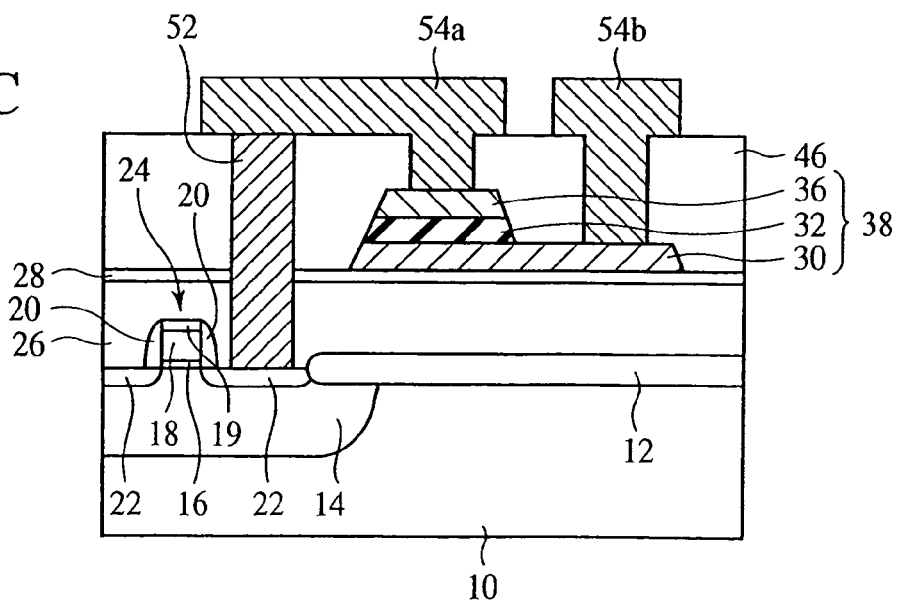

Next, a conduction film of, e.g., a TiN film, an AlCu alloy film, a Ti film, a TiN film, etc. laid one on another is formed on the entire surface. Next, the conduction film is patterned by photolithography and dry etching to the interconnection 54a electrically interconnecting the upper electrode 36 of the ferroelectric capacitor 38 and the conductor plug 52, and the interconnection 54b electrically connected to the lower electrode 30 of the ferroelectric capacitor 38 (FIG. 7C).

As described above, according to the present embodiment, a low-viscosity material is applied to the ferroelectric film 32 formed by MOCVD to form the buried layer 34, then, the entire surface is anisotropically etched to remove the tops of cavities in the surface of the ferroelectric film 32, and then the buried layer 34 remaining on the surface of the ferroelectric film 32 is removed, whereby the surface morphology of the ferroelectric film 32 can be improved. The surface of the ferroelectric film 32 is planarized, whereby when the conduction film 36 and the ferroelectric film 32 are patterned by photolithography, prescribed patterns as designed can be formed without reflecting the incident exposure light in various directions.

[A Second Embodiment]

The method for fabricating a semiconductor device according to a second embodiment of the present invention will be explained with reference to FIG. 9. FIG. 9 is sectional views of the semiconductor device in the steps of the method for fabricating the semiconductor device, which illustrate the method.

The method for fabricating a semiconductor device according to the present embodiment is different from the first embodiment in the method for improving the surface morphology of the ferroelectric film 32. In the present embodiment, the surface morphology of the ferroelectric film 32 is improved by the method illustrated in FIG. 9.

First, a material of a low viscosity of, e.g., 1–10 mPa·s (milli-Pascal second) is applied to the ferroelectric film 32 by sol-gel process, i.e., spin coating to form a buried layer 34 (FIG. 9A). Both cavities and convexities in the ferroelectric film 32 are filled with the buried layer 34. The buried layer 34 is formed in a thickness so as to bury the convexities on the surface of the ferroelectric film 32, e.g., an about 5–25 nm-thickness.

The buried layer 34 can be formed of a dielectric material, e.g., a resist material, a resist material excluding the photosensitizer, a silicon oxide-based material ($SiO_2$-based coating forming application liquid) or others.

Next, the entire surface is anisotropically etched by, e.g., sputter etching. The entire surface of the buried layer 34 is etched back, and then the tops of the convexities on the ferroelectric film 32 exposed out of the buried layer 34 are etched off (FIG. 9B). Thus, the height of the convexitits which has been 10–200 nm is reduced to about 3–5 nm, and the entire surface is planarized.

Conditions for the sputter etching at this time are, e.g., chlorine gas ($Cl_2$) and argon gas (Ar) as the etching gas, e.g., 1400 W applied as the source power, and, e.g., 800 W applied as bias power.

Then, the buried layer 34 remaining on the surface of the ferroelectric film 32 is removed, and the entire surface of the ferroelectric film 32 is exposed, planarized (FIG. 9C).

As described above, according to the present embodiment, a low-viscosity material is applied to the ferroelectric film 32 formed by MOCVD to form the buried layer 34, then, the entire surface is anisotropically etched to remove the tops of cavities in the surface of the ferroelectric film 32, and then the buried layer 34 remaining on the surface of the ferroelectric film 32 is removed, whereby the surface morphology of the ferroelectric film 32 can be improved. The surface of the ferroelectric film 32 is planarized, whereby when the conduction film 36 and the ferroelectric film 32 are patterned by photolithography, prescribed patterns as designed can be formed without reflecting the incident exposure light in various directions.

The present invention is not limited to the above-described embodiments and can cover other various modifications.

For example, in the above-described embodiments, the ferroelectric film 38 is formed of PZT film. However, the ferroelectric film 38 is not essentially formed of PZT film, and any other ferroelectric material can be suitably used. For example, the ferroelectric film 38 can be $Pb_{1-x}La_xZr_{1-y}Ti_yO_3$ film (PLZT film), $SrBi_2(Ta_xNb_{1-x})_2O_9$ film, $Bi_4Ti_2O_{12}$ film, or others.

In the above-described embodiments, the lower electrode 30 is formed of Pt film. However, the conductor film, etc. forming the lower electrode 30 are not essentially PZT. The lower electrode may be formed of, e.g., Ir film, $IrO_2$ film, Ru film, $RuO_2$ film, SrRuO (Strontium Ruthenium Oxide) film (SRO film), Pd film, or a layer film of these films.

In the above-described embodiments, the upper electrode 36 is formed of $IrO_x$ film. However, the conductor film, etc. forming the upper electrode 36 is not essentially to $IrO_x$ film. The upper electrode 36 may be formed of, e.g., Ir film, Ru film, $RuO_2$ film, SRO film, Pd film or a layer film of these films.

In the above-described embodiments, as the insulation film forming the inter-layer insulation film, silicon oxide film is formed. However, in place of silicon oxide film, various insulation films can be formed.

In the above-described embodiments, the method for planarizing the surface of the insulation films forming the inter-layer insulation films is CMP. However, the method for planarizing the surfaces of the insulation films is not essentially CMP. For example, the surface of the insulation film may be planarized by etching. The etching gas can be, e.g., Ar gas.

In the above-described embodiments, the 1T1C-type memory cell including one transistor 24 and one ferroelectric capacitor 42 is formed. However, the structure of the memory cell is not essentially of the 1T1C-type. The memory cell may be of various types, such as 2T2C-type including 2 transistors and 2 ferroelectric capacitors.

The above-described embodiments are explained by means of the semiconductor devices of FeRAM structure including the planar cells. However, the application of the present invention is not limited to this. For example, the present invention is applicable to semiconductor devices of FeRAM structure including stacked cells and having the gate length set at, e.g., 0.18 μm.

What is claimed is:

1. A method for fabricating a semiconductor device comprising the steps of:
    forming a ferroelectric film by metal organic chemical vapor deposition;
    forming a buried layer filling a multitude of cavities formed throughout a surface of the ferroelectric film;
    etching from above the buried layer to remove tops of convexities of the surface of the ferroelectric film to thereby planarize the surface of the ferroelectric film; and
    removing the buried layer remaining on the surface of the ferroelectric film.

2. A method for fabricating a semiconductor device according to claim 1, wherein
    in the step of forming a buried layer, the buried layer is formed in a thickness so as to expose the convexities of the surface of the ferroelectric film out of the buried layer.

3. A method for fabricating a semiconductor device according to claim 1, wherein
    in the step of forming a buried layer, the buried layer is formed in thickness so as to bury the convexities of the surface of the ferroelectric film in the buried layer.

4. A method for fabricating a semiconductor device according to claim 1, wherein
    in the step of burying a buried layer, a material to be buried is applied to the surface of the ferroelectric film by spin coating.

5. A method for fabricating a semiconductor device according to claim 4, wherein
    the dielectric material is a resist material, a ferroelectric material or silicon oxide-based material.

6. A method for fabricating a semiconductor device according to claim 1, wherein
    the ferroelectric film is $PbZr_{1-x}TixO_3$ film, $Pb_{1-x}La_xZr_{1-y}Ti_yO'$ film, $SrBi_2(Ta_xNb_{1-x})_2O_9$ film or $Bi_4Ti_2O_{12}$ film.

7. A method for fabricating a semiconductor device according to claim 1, wherein
    in the step of planarizing the surface of the ferroelectric film, the etching is preformed anisotropically from above the buried layer.

8. A method for fabricating a semiconductor device according to claim 7, wherein
    in the step of planarizing the surface of the ferroelectric film, reactive ion etching is performed from above the buried layer.

9. A method for fabricating a semiconductor device according to claim 1, further comprising the steps of:
    forming a conduction film on the ferroelectric film;
    forming a resist layer on the conduction film;
    expose and develop the resist layer to pattern the same; and
    etching the conduction film with a patterned resist layer as a mask to pattern the conduction film.

10. A method for fabricating a semiconductor device according to claim 9, wherein
    the conduction film is $IrO_x$ film, Ir film, Ru film, $RuO_2$ film, SRO film, Pd film, or a layer film of said films.

* * * * *